United States Patent
Bruce et al.

(10) Patent No.: US 8,196,600 B1
(45) Date of Patent: Jun. 12, 2012

(54) HIGH-TEMPERATURE JOINTED ASSEMBLIES AND WEAR-RESISTANT COATING SYSTEMS THEREFOR

(75) Inventors: Robert William Bruce, Loveland, OH (US); Karen Marie Marvich, West Chester, OH (US); Danny Lee Fenwick, Lebanon, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/978,931

(22) Filed: Dec. 27, 2010

(51) Int. Cl.
*F16K 15/03* (2006.01)
*C23C 16/34* (2006.01)

(52) U.S. Cl. ............. 137/375; 137/527; 137/527.8; 428/615; 428/666

(58) Field of Classification Search ............. 137/375, 137/257, 527.8; 251/368; 428/615, 666
See application file for complete search history.

(56) References Cited

U.S. PATENT DOCUMENTS

| | | | |
|---|---|---|---|
| 4,741,975 A | 5/1988 | Naik et al. | |
| 4,839,245 A | 6/1989 | Sue et al. | |
| 4,904,528 A | 2/1990 | Gupta et al. | |
| 6,398,103 B2 | 6/2002 | Hasz et al. | |
| 6,905,773 B2 * | 6/2005 | Hein et al. | 428/450 |
| 7,186,092 B2 | 3/2007 | Bruce et al. | |
| 7,504,276 B2 * | 3/2009 | Hasebe et al. | 438/53 |
| 7,998,581 B2 * | 8/2011 | Yasui et al. | 428/403 |
| 2001/0031347 A1 * | 10/2001 | Vetter et al. | 428/216 |
| 2006/0018760 A1 * | 1/2006 | Bruce et al. | 416/229 A |
| 2006/0024140 A1 * | 2/2006 | Wolff et al. | 408/1 R |
| 2006/0110246 A1 * | 5/2006 | Bruce | 415/160 |
| 2006/0217224 A1 * | 9/2006 | Girg et al. | 474/206 |
| 2007/0162137 A1 * | 7/2007 | Kloss et al. | 623/17.15 |
| 2008/0124531 A1 * | 5/2008 | Hanyu et al. | 428/216 |
| 2009/0068450 A1 * | 3/2009 | Muenz et al. | 428/336 |
| 2009/0241632 A1 * | 10/2009 | Young | 72/470 |
| 2010/0304181 A1 * | 12/2010 | Anand et al. | 428/627 |

FOREIGN PATENT DOCUMENTS

DE 102005001157 A1 * 8/2005
GB 2326222 A * 12/1998

* cited by examiner

*Primary Examiner* — John Rivell
(74) *Attorney, Agent, or Firm* — William Scott Andes; Gary M. Hartman; Domenica N. S. Hartman

(57) ABSTRACT

Wear-resistant coating systems suitable for protecting surfaces subjected to contact wear at high temperatures, such as surfaces of an assembly comprising high-temperature components of gas turbine engines. The components have surfaces in wear contact with each other. One of the surfaces has a wear-resistant coating system thereon so as to be in wear contact with the surface of the other component. The wear-resistant coating system contains alternating layers of TiAlN and CrN.

20 Claims, 6 Drawing Sheets

HIGH-TEMPERATURE JOINTED ASSEMBLIES AND WEAR-RESISTANT COATING SYSTEMS THEREFOR

BACKGROUND OF THE INVENTION

The present invention generally relates to components and materials suitable for use in high temperature applications, such as gas turbine engines. More particularly, this invention is directed to assemblies with joints subjected to high temperatures and wear-resistant coating systems for such joints.

Higher operating temperatures for gas turbine engines are continuously sought in order to increase their efficiency. Significant advances in high temperature capabilities have been achieved through the formulation of iron, nickel and cobalt-base superalloys, whose high temperature properties enable components to withstand long exposures to operating temperatures within the compressor, turbine, combustor and augmentor sections of high-performance gas turbine engines. Certain components that require attachment with articulating joints create design challenges in view of the high temperatures, vibration and corrosive environment within a gas turbine engine. For example, pins, trunnions and other components employed to pivotably secure other components must have physical properties that are compatible with adjacent components and exhibit resistance to contact wear and corrosion over long durations at high temperatures.

FIG. 1 schematically represents an assembly 10 comprising an articulating joint defined by a pin 12 that pivotably supports a component 14 (represented in cross-section) to allow the component 14 to pivot about the axis of the pin 12. As an example, the pin 12 may be a hinge pin for a flapper valve, such as of the type used in gas turbine engines to regulate the cooling air flow to air-cooled turbine components. The diametric clearance between the pin 12 and component 14 is exaggerated for purposes of illustration. As schematically represented in FIG. 1, the shank 16 of the pin 12 has been severely worn as a result of the pivoting motion and vibration of the component 14 relative to the pin 12. Wear has primarily occurred on the shank 16 of the pin 12, though it is foreseeable that the inverse situation could exist. Localized damage to the wear surfaces of the pin 12 and component 14 can be accelerated by the effects of corrosion within the hostile environment of the turbine engine.

In one particular application, flapper valves formed of the nickel-base alloy Inconel (IN) 625 (nominal composition of, by weight, about 21.5% chromium, about 9.0% molybdenum, about 3.6% niobium 2.5% iron, about 0.2% aluminum, about 0.2% titanium, about 0.2% manganese, about 0.2% silicon, about 0.05% carbon, the balance nickel and incidental impurities) have been observed to rapidly wear when secured with a hinge formed of the cobalt-base alloy L-605 (HA25) (nominal composition of, by weight, about 20.0% chromium, about 10.0% nickel, about 15.0% tungsten, and about 0.5% carbon, the balance cobalt and incidental impurities). Though this combination of materials has been very reliable in gas turbine engine applications, more severe operating conditions have lead to more rapid wear rates, while simultaneously a longer wear life has been sought for the assembly.

A wide variety of coating materials are known and widely used to protect components of gas turbine engines, including hard impact and erosion-resistant coating materials such as nitrides and carbides. For example, see U.S. Pat. No. 4,904,528 to Gupta et al. (titanium nitride (TiN) coatings), U.S. Pat. No. 4,839,245 to Sue et al. (zirconium nitride (ZrN) coatings), U.S. Pat. No. 4,741,975 to Naik et al. (tungsten carbide (WC) and tungsten carbide/tungsten (WC/W) coatings), U.S. Pat. No. 7,186,092 to Bruce et al. (combinations of tantalum carbide (TaC), niobium carbide (NbC), titanium carbide (TiC), titanium aluminum chromium carbide (TiAlCrC), titanium aluminum chromium nitride (TiAlCrN), titanium aluminum nitride (TiAlN), titanium aluminum carbide (TiAlC), and boron carbide ($B_4C$)) and U.S. Published Patent Application Nos. 2009/0011195 and 2010/0078308 to Bruce et al. (combinations of TiAlN, chromium nitride (CrN) and titanium silicon carbonitride (TiSiCN)). However, these coating materials are primarily intended to promote the impact and erosion resistance of blades, as opposed to surfaces continuously subjected to contact wear.

Wear-resistant coatings intended for surfaces subject to contact wear have also been proposed for use in the high-temperature environment of gas turbine engines. Examples include thermal sprayed coatings of chromium carbide and Co—Mo—Cr—Si alloys, such as the commercially-available TRIBALOY® T400 and T800 alloys. These wear-resistant materials have also been applied as foils, as taught in U.S. Pat. No. 6,398,103 to Hasz et al. Nonetheless, there is an ongoing need for improved material combinations that would enable pivot joint assemblies to exhibit longer service lives in the hostile environment of a gas turbine engine.

BRIEF DESCRIPTION OF THE INVENTION

The present invention provides wear-resistant coatings suitable for protecting surfaces subjected to contact wear at high temperatures, such as surfaces of articulating joints formed by high-temperature components of gas turbine engines.

According to one aspect of the invention, an assembly is provided comprising first and second components having surfaces in wear contact with each other. One of the surfaces has a wear-resistant coating system thereon so as to be in wear contact with the surface of the other component. The wear-resistant coating system consists of alternating layers of TiAlN and CrN.

Another aspect of the invention is a method of forming the assembly described above by depositing the alternating layers of TiAlN and CrN using a physical vapor deposition process.

Another aspect of the invention is that the assembly comprises a pivot joint defined by the first and second components, in which the first component defines a pivot axis and the second component is pivotably coupled to the first component so as to pivot about the pivot axis of the first component.

A technical effect of the invention is the ability to significantly improve the wear resistance of surfaces in wear contact at high temperatures. The invention is capable of reducing wear by a factor of nearly 50× based on the use of the same base materials for the first and second components. Further improvements can be achieved through the use of different combinations of base materials.

Other aspects and advantages of this invention will be better appreciated from the following detailed description.

DETAILED DESCRIPTION OF THE INVENTION

Figure 1:
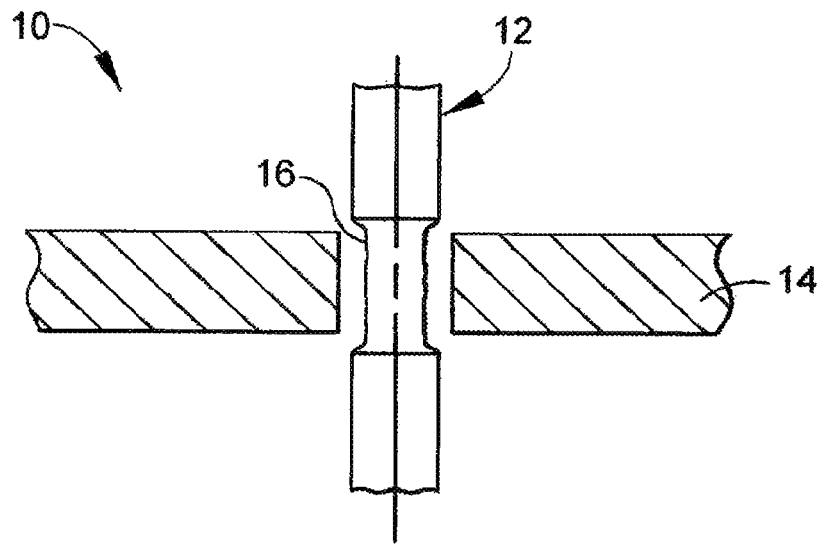
FIG. 1 represents a fragmentary cross-sectional view of an assembly comprising two components that form a pivot joint, wherein the joint has become worn as a result of pivot motion and vibration.
Figure 2:
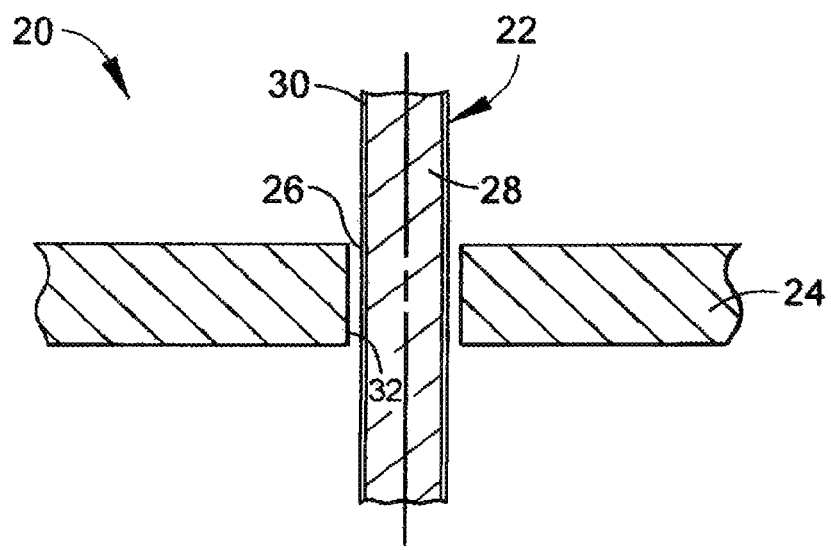
FIG. 2 represents a fragmentary cross-sectional view of an assembly similar to FIG. 1, wherein one of the components has been provided with a wear-resistant coating system in accordance with an embodiment of the invention.

FIG. 2 represents an assembly 20 that is similar to what is represented in FIG. 1, in that two components 22 and 24 are represented as being pivotably coupled together to define a pivot joint. In a particular embodiment, and for purposes of discussing the invention, the first and second components 22 and 24 are, respectively, a hinge pin 22 and flapper valve 24, such as a flapper valve used to regulate the cooling air flow to air-cooled components of a turbine engine, though other applications are foreseeable and also within the scope of the invention. In such an application, the pin 22 pivotably supports the flapper valve 24 to allow the valve 24 to pivot about the axis of the pin 22. In contrast to the severely worn shank 16 of FIG. 1, the cylindrical-shaped shank 26 of the pin 22 is schematically represented in cross-section as provided with a coating system 30 that overlies the base material 28 of the pin 22. According to a preferred aspect of the invention, the coating system 30 is resistant to wear resulting from contact between the pin 22 and valve 24, including severe wear conditions that can result from high temperatures and vibration within the operating environment of a gas turbine engine. The coating system 30 is shown as being applied to only the shank 26 of the pin 22, though it should be understood that the coating system 30 could be deposited on the opposing surface 32 of the valve 24. It should be noted that the diametric clearance between the pin 22 and valve 24 is exaggerated in FIG. 2 for purposes of illustration. Diametric clearances for flapper valve applications within gas turbine engines will typically range from about 75 to about 300 micrometers, and the contact between the shank 26 and the opposing surface 32 of the valve 24 will typically range from about 10 to about 300 millimeters along the axial length of the shank 26, though lesser and greater clearances and contact lengths are also within the scope of the invention.

As previously discussed in reference to FIG. 1, in one particular application for assemblies of the type represented in FIG. 2, the flapper valve 24 is formed of the nickel-base alloy Inconel (IN) 625, and the hinge pin 22 is formed of the cobalt-base alloy L-605. Because this combination of materials has exhibited high wear rates at increasingly severe engine operating conditions, the coating system 30 of this invention serves to reduce wear and promote a longer life for the assembly 20.

Figure 3:
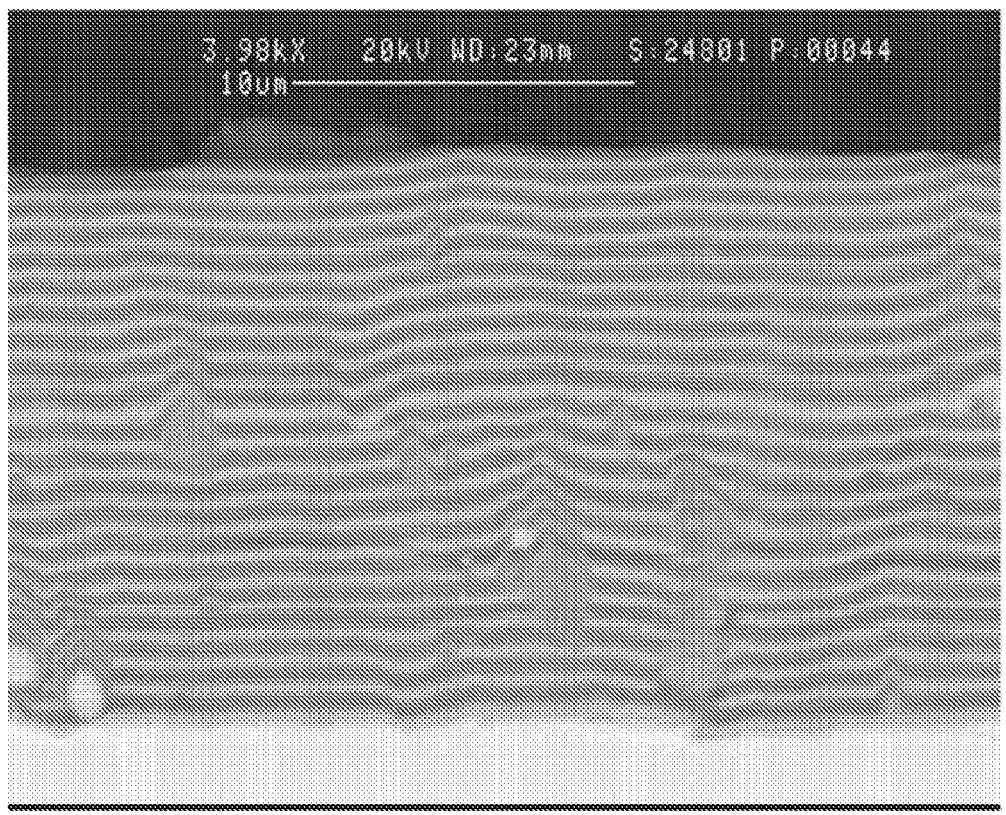
FIG. 3 is a scanned image of a wear-resistant coating system in accordance with an embodiment of the present invention.

In preferred embodiments of the invention, the coating system 30 contains multiple layers of ceramic materials, and more particularly multiple layers of titanium aluminum nitride (TiAlN) and chromium nitride (CrN) in combination (for example, alternating layers) without any intervening ceramic or metallic layers therebetween. An example of a TiAlN—CrN coating system 30 is shown in FIG. 3, with individual alternating layers of TiAlN and CrN being visible as alternating light and dark layers, respectively. Each individual layer of the coating system 30 has a thickness of at least 0.20 micrometers and a maximum thickness of about 0.80 micrometers, with a suitable range being about 0.30 to about 0.50 micrometers. The thicknesses of the TiAlN and CrN layers are preferably the same, though it is foreseeable that the TiAlN or CrN layers could be deposited to be intentionally thicker than the other. The individual layers are deposited in appropriate numbers and thicknesses to obtain the desired thickness for the coating system 30. The entire coating system 30 preferably has a thickness of at least 6 micrometers, for example, about 30 to about 50 micrometers. Coating thicknesses exceeding 80 micrometers are believed to be unnecessary in terms of wear resistance. A bond coat (not shown) may be used to promote the adhesion of the coating system 30 to the base material 28 of the pin 22. The bond coat may be made up of one or more metal layers, for example, one or more layers of titanium.

Coatings of this invention are preferably deposited by a physical vapor deposition (PVD) technique, and therefore will generally have a columnar and/or dense microstructure, as opposed to the noncolumnar, irregular, and porous microstructure that would result if the coating were deposited by a thermal spray process. Particularly suitable PVD processes include EB-PVD, cathodic arc PVD, and sputtering, with cathodic arc believed to be preferred. Suitable sputtering techniques include but are not limited to direct current diode sputtering, radio frequency sputtering, ion beam sputtering, reactive sputtering, magnetron sputtering, plasma-enhanced magnetron sputtering, and steered arc sputtering. Cathodic arc PVD and plasma-enhanced magnetron sputtering are particularly preferred for producing coatings due to their high coating rates. Deposition can be carried out in an atmosphere containing a source of nitrogen (for example, nitrogen gas) to form the nitride constituents of the deposited coating system 30. Any metallic bond coat employed with the coating system 30 is preferably deposited in an inert atmosphere, for example, argon.

The coating system 30 preferably has a surface roughness of about 50 microinches (about 1.2 micrometers) Ra or less. The base material 28 of the pin 22 and/or the coating system 30 may undergo polishing to achieve this surface finish. Polishing of the base material 28 can be performed before coating deposition to promote the deposition of a smooth coating system 30, with additional polishing performed after coating deposition to ensure that the desired coating surface roughness is obtained. Polishing can also be performed as an intermediate step of the coating process.

In a preliminary investigation leading to the present invention, wear tests were conducted on specimens at test temperatures of about 75° F., 400° F. and 750° F. (about 75° C., 200° C. and 400° C.). The wear tests were reciprocating sliding wear tests utilizing a contact zone of about 25×3.75 mm, with the sliding motion occurring over a distance of about 1.5 mm in a direction parallel to the smaller dimension of the contact zone. The test specimens were formed of titanium, steel, nickel and aluminum alloys, including M-152, Alloy 17-4PH, A-286, IN-718, Nitronic 60®, and Aluminum 2219. The evaluated coatings included five nitride coatings: TiN, TiAlN, TiSiCN, alternating layers of TiAlN and CrN, and alternating layers of TiSiAlN and CrN. For comparison, additional test specimens were coated with WC/Co cermet and TRIBALOY T400, the latter being a cobalt-based hardface alloy available from Deloro Stellite Inc. Though well known as being excellent wear-resistant coating materials, the WC/Co and TRIBALOY T400 coatings were not deemed to be acceptable candidates for the flapper valve and similar applications since they would be deposited by HVOF, rendering these coatings difficult to deposit on a small diameter pin, and would require expensive surface treatments to achieve the surface finish desired for the flapper valve. Of the experimental coating compositions, the coatings formed of alternating layers of TiAlN and CrN performed the best, and exhibited wear resistance approaching that of WC/Co.

Based on the results of the preliminary investigation, a second investigation was conducted with coatings formed of alternating layers of TiAlN and CrN. FIGS. 4 through 7 contain graphs summarizing data obtained with the second investigation. Evaluated test specimens were configured to comprise an anvil and striker. The wear tests utilized a contact surface of about 4×12 mm on the anvil, with initial motion of the striker and impact occurring in a direction perpendicular to the contact surface of the anvil, followed by a sliding motion of the striker in the length direction of the contact surface. The test was performed with a load of about 2.5 ksi (about 17 MPa), a stroke of about 17 mils (about 0.43 mm) and a frequency of about 35 Hz. All test specimens were evaluated in a rig supplied with air heated to about 800° F. (about 425° C.) to obtain a specimen temperature of about 650° F. (about 345° C.).

Along with baseline specimens, two sets of uncoated specimens were evaluated along with four sets of coated specimens. The baseline specimens employed an anvil formed of IN-625 and a striker formed of L-605 which, as noted above, are valve and pin materials for a flapper valve assembly currently used in an existing gas turbine engine application. For one of the sets of uncoated specimens, both the anvil and striker were formed of L-605. For the second set of uncoated specimens, both the anvil and striker were formed of Stellite 6B (Haynes 6B), a cobalt-based alloy available from Deloro Stellite Inc., and having a nominal composition of, by weight, 3.0% nickel, 30.0% chromium, 1.0% iron, 1.0% carbon, 1.4% manganese, 1.5% molybdenum, 4.0% tungsten, the balance cobalt and incidental impurities. Four coating systems containing alternating layers of TiAlN and CrN were evaluated with four different anvil-striker combinations: an M-152 anvil and L-605 striker, an IN-625 anvil and L-605 striker, an L-605 anvil and L-605 striker, and a Stellite 6B anvil and L-605 striker. The coating system was deposited by PVD on the strikers to thicknesses of about 50 micrometers, and contained layers of TiAlN having thicknesses of about 0.5 micrometer and layers of CrN having thicknesses of about 0.5 micrometer.

Figure 4:
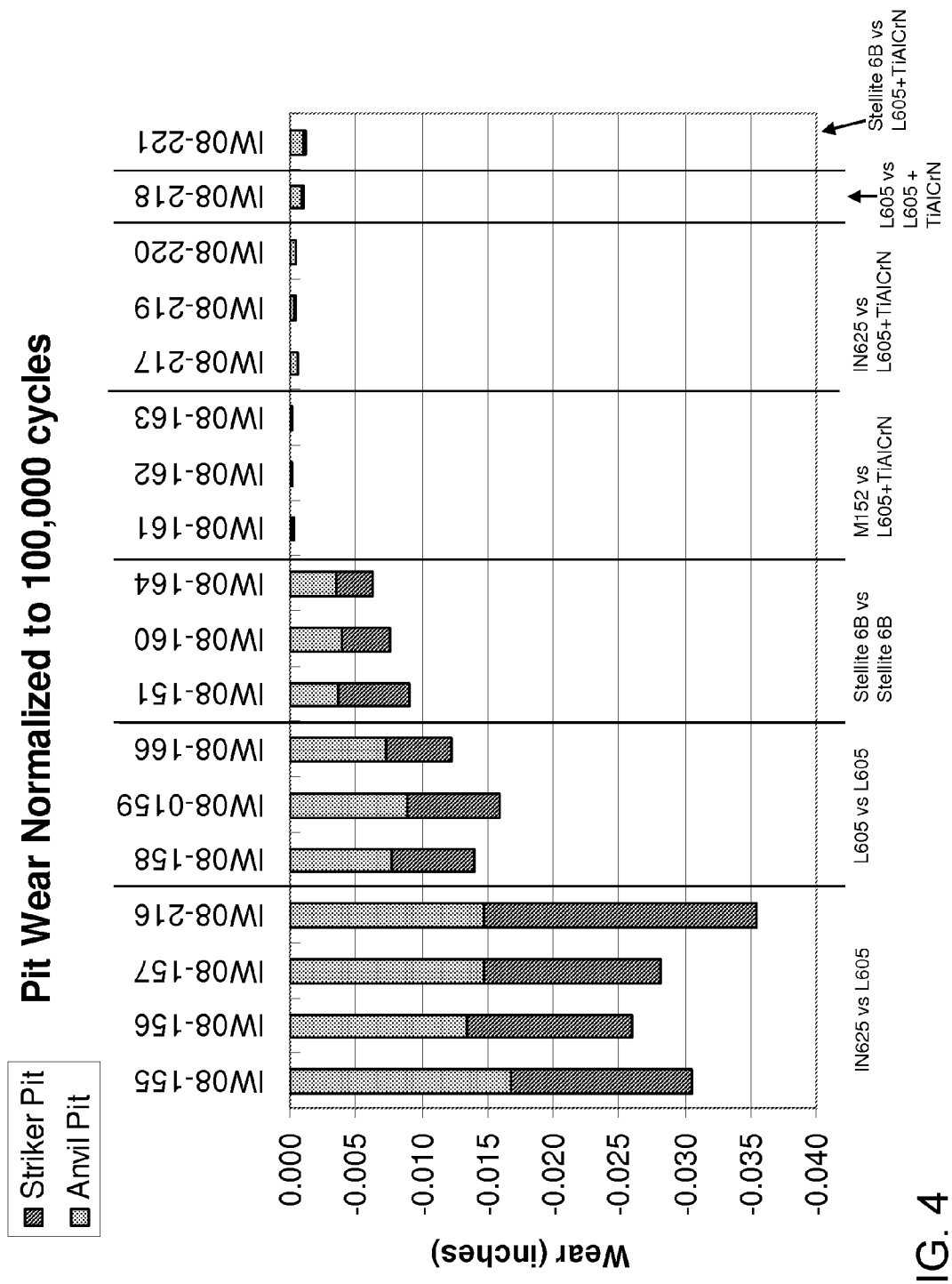
FIGS. 4 through 7 are bar graphs representing data from comparative wear tests performed on coating compositions, including wear-resistant coating systems of this invention.
Figure 5:
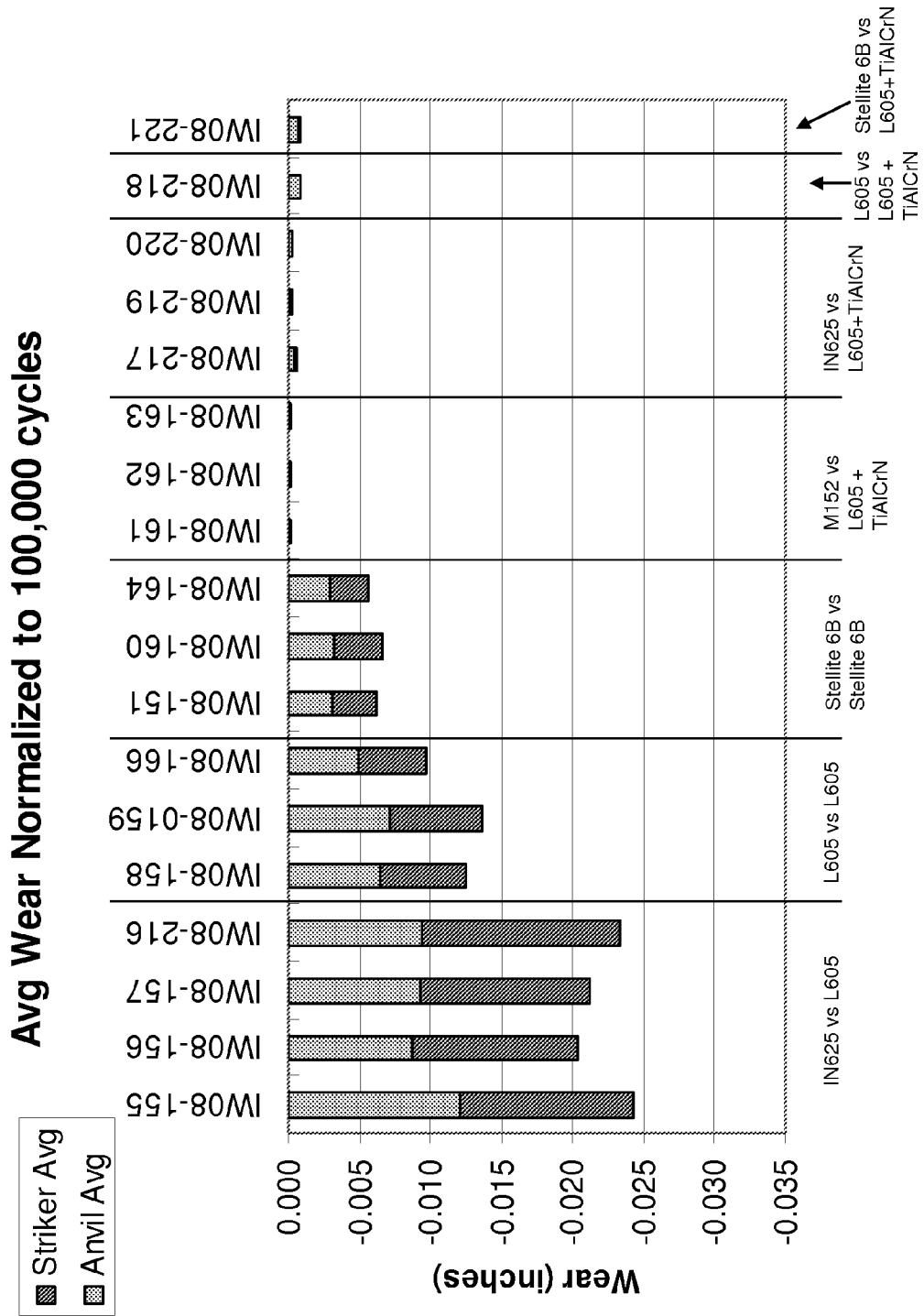
Figure 6:
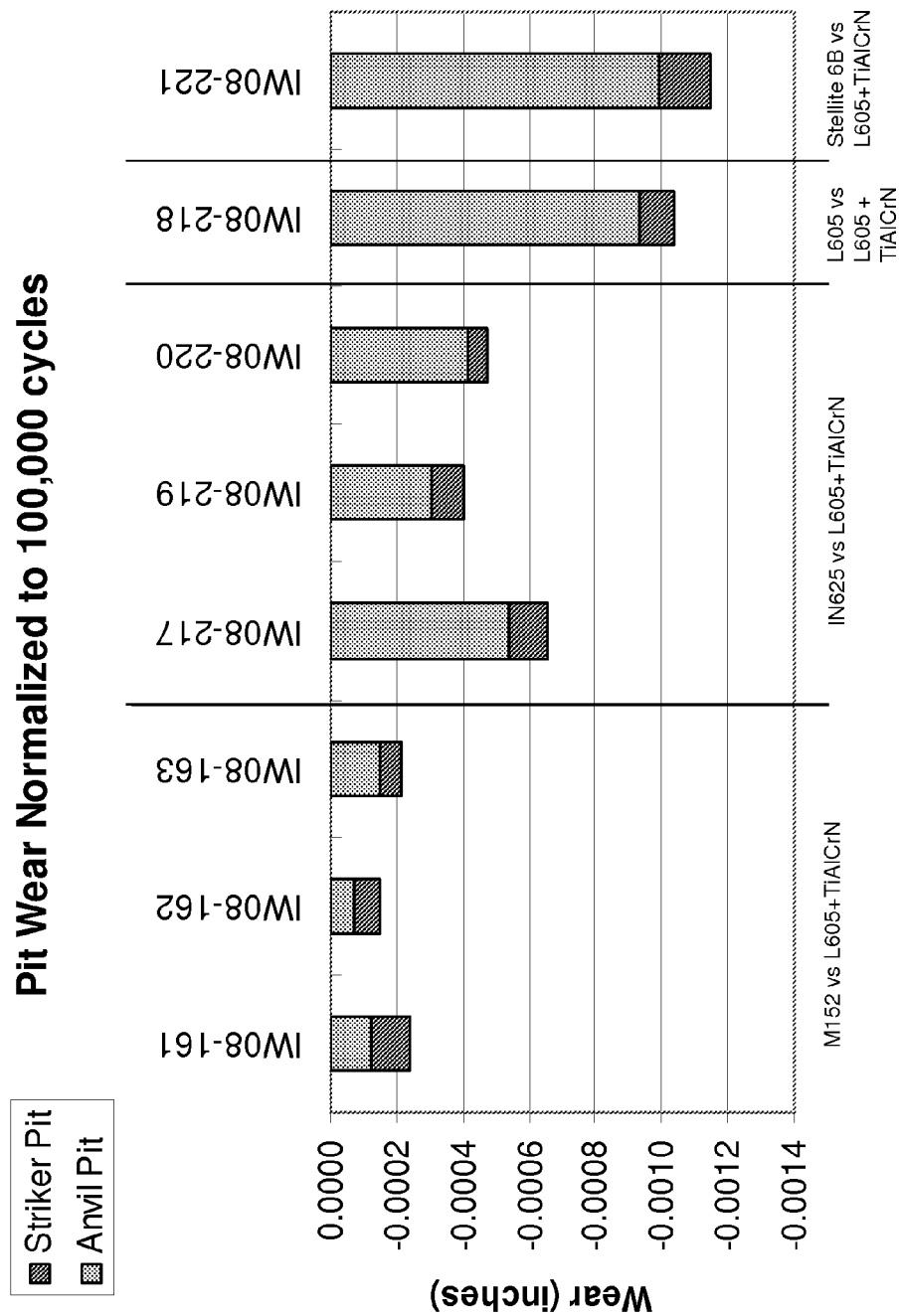
Figure 7:
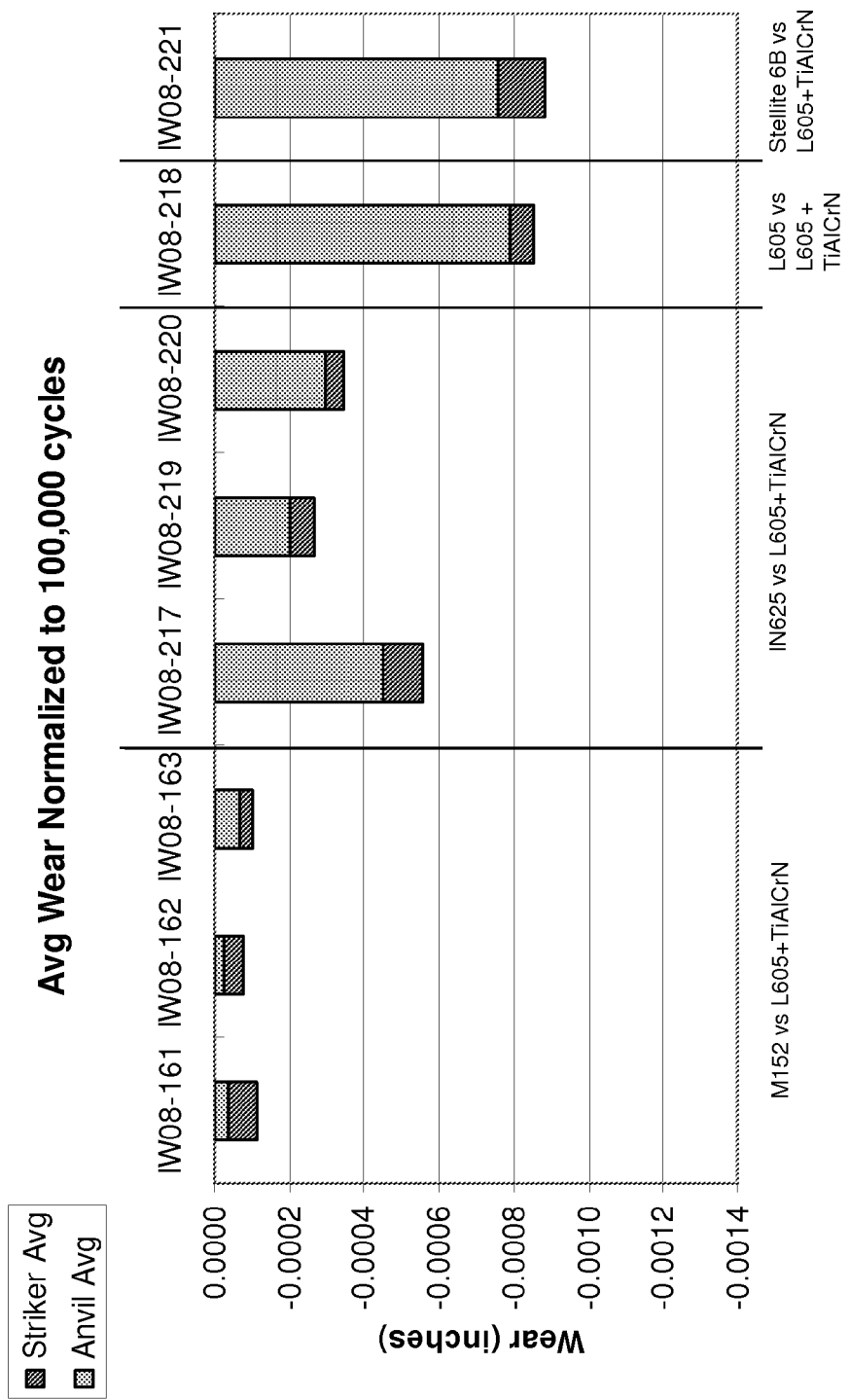

FIGS. 4 and 5 plot the deepest pit and average wear results for the baseline and uncoated specimens as well as the TiAlN—CrN coated specimens. FIGS. 6 and 7 plot the pit and average wear results for only the nitride test specimens. All results are normalized to 100,000 cycles. From these results, it can be seen that the specimens combining an M-152 anvil and coated L-605 striker performed the best, and the specimens combining an IN-625 anvil and coated L-605 striker also performed extremely well. The specimens with the M-152 anvil and coated L-605 striker exhibited an average wear of nearly 100× less than the baseline IN-625 anvil and uncoated L-605 striker, and the specimens combining the IN-625 anvil and coated L-605 striker exhibited an average wear of nearly 50× less than the baseline IN-625 anvil and uncoated L-605 striker.

From these results, it was concluded that the TiAlN—CrN coating system performed very well when applied to a base material of the cobalt-based L-605 alloy and subjected to wear from a member formed of IN-625 or M-152. As such, the invention encompasses assemblies (including flapper valve assemblies) in which components formed of L-605 and either IN-625 or M-152 are in wear contact with each other at elevated temperatures, and particularly operating temperatures of about 425° C. and higher. L-605 is a cobalt-base alloy L-605 having a nominal composition of, by weight, about 20.0% chromium, about 10.0% nickel, about 15.0% tungsten, about and 0.5% carbon, with the balance cobalt and incidental impurities. It is believed that similar results could be expected if the pin 22 were to be formed of a similar cobalt-base alloy. IN-625 is a solid solution-strengthened nickel-based alloy having a nominal composition of, by weight, about 21.5% chromium, about 9.0% molybdenum, about 3.6% niobium, about 2.5% iron, about 0.2% aluminum, about 0.2% titanium, about 0.2% manganese, about 0.2% silicon, about 0.05% carbon, with the balance nickel and incidental impurities. M-152 is a chromium-containing martensitic stainless steel alloy having a nominal composition of, by weight, about 2.5% nickel, about 12% chromium, about 1.7% molybdenum, about 0.3% vanadium, about 0.12% carbon, with the balance iron and incidental impurities. It is believed that similar results could be expected if the flapper valve 24 were to be formed of a solid solution-strengthened nickel-based alloy similar to IN-625 or a chromium-containing martensitic stainless steel similar to M-152. Because M-152 is typically available as forging or castings produced by centrifugal casting techniques, IN-625 is believed to be a more practical material for applications such as the flapper valve assembly of FIG. 2.

While the invention has been described in terms of specific embodiments, it is apparent that other forms could be adopted by one skilled in the art. Therefore, the scope of the invention is to be limited only by the following claims.

The invention claimed is:

1. An assembly comprising first and second components having surfaces in wear contact with each other, one of the surfaces having a wear-resistant coating system thereon so as to be in wear contact with the surface of the other component, the wear-resistant coating system consisting of alternating layers of TiAlN and CrN.

2. The assembly according to claim 1, wherein individual layers of TiAlN have a thickness of at least 0.2 micrometers and up to about 0.8 micrometer.

3. The assembly according to claim 1, wherein individual layers of TiAlN have a thickness of about 0.3 to about 0.5 micrometer.

4. The assembly according to claim 1, wherein individual layers of CrN have a thickness of at least 0.2 micrometers and up to about 0.8 micrometer.

5. The assembly according to claim 1, wherein individual layers of CrN have a thickness of about 0.3 to about 0.5 micrometer.

6. The assembly according to claim 1, wherein the wear-resistant coating system has a thickness of at least 6 micrometers.

7. The assembly according to claim 1, wherein the wear-resistant coating system has a thickness of up to about 80 micrometers.

8. The assembly according to claim 1, wherein the wear-resistant coating system has a thickness of about 30 to about 50 micrometers.

9. The assembly according to claim 1, wherein the first and second components define a pivot joint, the first component defines a pivot axis, and the second component is pivotably coupled to the first component so as to pivot about the pivot axis of the first component.

10. The assembly according to claim 1, wherein the first component is formed of a cobalt-base alloy, and the second component is formed of either a solid solution-strengthened nickel-based alloy or a chromium-containing martensitic stainless steel.

11. The assembly according to claim 10, wherein the cobalt-base alloy has a nominal composition of, by weight, about 20.0% chromium, about 10.0% nickel, about 15.0% tungsten, about and 0.5% carbon, with the balance cobalt and incidental impurities.

12. The assembly according to claim 10, wherein the second component is formed of the solid solution-strengthened nickel-based alloy and has a nominal composition of, by weight, about 21.5% chromium, about 9.0% molybdenum, about 3.6% niobium, about 2.5% iron, about 0.2% aluminum, about 0.2% titanium, about 0.2% manganese, about 0.2% silicon, about 0.05% carbon, with the balance nickel and incidental impurities.

13. The assembly according to claim 10, wherein the second component is formed of the chromium-containing martensitic stainless steel and has a nominal composition of, by weight, about 2.5% nickel, about 12% chromium, about 1.7% molybdenum, about 0.3% vanadium, about 0.12% carbon, with the balance iron and incidental impurities.

14. The assembly according to claim 1, wherein the wear-resistant coating system is present on the surface of the first component and the surface thereof is cylindrical in shape.

15. The assembly according to claim 1, wherein the assembly is a flapper valve assembly, the first component is a hinge pin, and the second component is a flapper valve.

16. The assembly according to claim 15, wherein the flapper valve assembly is installed in a gas turbine engine.

17. The assembly according to claim 16, wherein the flapper valve assembly is installed to control cooling air flow to air-cooled components of the gas turbine engine.

18. A method of forming the assembly of claim 1, the method comprising depositing the layers of TiAlN and CrN by a physical vapor deposition process.

19. A flapper valve assembly installed in a gas turbine engine to control cooling air flow to air-cooled components of the gas turbine engine, the flapper valve assembly comprising a pivot joint defined by a hinge pin that defines a pivot axis and a flapper valve pivotably coupled to the hinge pin so as to pivot about the pivot axis of the hinge pin, the hinge pin and the flapper valve having surfaces in wear contact with each other, the hinge pin being formed of a cobalt-based alloy, the flapper valve being formed of either a solid solution-strengthened nickel-based alloy or a chromium-containing martensitic stainless steel, the surface of the hinge pin having a wear-resistant coating system thereon so as to be in wear contact with the surface of the flapper valve, the wear-resistant coating system consisting of alternating layers of TiAlN and CrN, individual layers of TiAlN having a thickness of about 0.3 to about 0.5 micrometers, individual layers of CrN having a thickness of about 0.3 to about 0.5 micrometers, and the wear-resistant coating system having a thickness of about 30 to about 50 micrometers.

20. A method of forming the assembly of claim 19, the method comprising depositing the layers of TiAlN and CrN by a physical vapor deposition process.

* * * * *